United States Patent
Winkler et al.

(10) Patent No.: US 7,186,075 B2
(45) Date of Patent: Mar. 6, 2007

(54) MINI FAN TO BE FIXED IN A RECESS OF A WALL

(75) Inventors: Wolfgang Arno Winkler, St. Georgen (DE); Nils Rapp, St. Georgen (DE)

(73) Assignee: ebm-papst St. Georgen GmbH & Co., KG, St. Georgen (DE)

( * ) Notice: Subject to any disclaimer, the term of this patent is extended or adjusted under 35 U.S.C. 154(b) by 39 days.

(21) Appl. No.: 10/525,118

(22) PCT Filed: Jun. 5, 2004

(86) PCT No.: PCT/EP2004/006102

§ 371 (c)(1),
(2), (4) Date: Feb. 18, 2005

(87) PCT Pub. No.: WO2005/009098

PCT Pub. Date: Jan. 27, 2005

(65) Prior Publication Data
US 2005/0271515 A1 Dec. 8, 2005

(30) Foreign Application Priority Data
Jul. 15, 2003 (DE) .......................... 203 11 309 U (51) Int. Cl.
*F01D 25/04* (2006.01)
*F01D 25/24* (2006.01)

(52) U.S. Cl. ................. 415/119; 415/213.1; 415/214.1; 415/220

(58) Field of Classification Search ............... 415/119, 415/213.1, 214.1, 220
See application file for complete search history.

(56) References Cited

U.S. PATENT DOCUMENTS

| 4,568,243 | A | * | 2/1986 | Schubert et al. | ......... 415/213.1 |
| 4,750,860 | A | * | 6/1988 | Kelley | ........................ 415/119 |
| 4,819,503 | A | | 4/1989 | Fazi, Jr. et al. | ............... 74/574 |
| 4,908,929 | A | * | 3/1990 | Fazi et al. | ............... 29/525.13 |
| 5,208,730 | A | | 5/1993 | Tracy | ........................ 361/384 |
| 5,713,790 | A | * | 2/1998 | Lin | ............................ 361/695 |
| 2002/0060900 | A1 | | 5/2002 | Qiu | ........................... 361/683 |

* cited by examiner

*Primary Examiner*—Igor Kershteyn
(74) *Attorney, Agent, or Firm*—Milton Oliver; Ware Fressola Van Der Sluys & Adolphson LLP (57) ABSTRACT

A mini-fan (126) is implemented for installation in a recess (124) of a wall (122), which wall is equipped on the periphery of the recess (124) with a plurality of retaining members (128, 129). The fan has, for air guidance, a housing (136) that, in its installed position, projects with a housing portion (127) approximately complementary to the recess (124) of the wall (122) into that recess. Arranged on the periphery of that housing portion is at least one part (138) made of an elastomeric material, with which part the fan (126) is introducible, upon its installation with the part (138) made of elastomeric material with displacement along the wall (122), into the retaining members (128, 129), in order to bring that part (138), in the installed position, at least locally into sealing contact against the wall (122).

21 Claims, 7 Drawing Sheets

MINI FAN TO BE FIXED IN A RECESS OF A WALL

CROSS-REFERENCE TO RELATED APPLICATIONS

This application is a §371 of PCT/EP2004/006102, filed 5 Jun. 2004, which claims priority of DE 203 11 309.8, filed 15 Jul. 2003, which is hereby incorporated by reference.

FIELD OF THE INVENTION

The invention concerns a mini-fan for mounting in a recess of a wall.

BACKGROUND

Mini-fans, also called miniature or subminiature fans, are used, for example, to cool processors in computers, for equipment cooling in small equipment items, etc., and have very small dimensions.

For example:
fans in the ebm-papst 250 series have dimensions of 8×25× 25 mm;
those in the ebm-papst 400 F series have dimensions of 10×40×40 mm;
those in the ebm-papst 400 series, 20×40×40 mm; and
fans in the ebm-papst 600 series, 25.4×60×60 mm.

The power consumption of such fans is 0.4–0.6 W for the 250 series, 0.7–0.9 W for the 400 F series, and 0.9–1.6 W for the 400 and 600 series.

With mini-fans, it is usual at present to mount them by means of screws. This has the disadvantage, however, that solid-borne sound can be transferred by way of this mounting from the fan to a wall, which correspondingly amplifies the noise. This type of mounting is moreover cost-intensive.

SUMMARY OF THE INVENTION

It is therefore an object of the invention to make available a new mini-fan that can be mounted in simple fashion on a recess of a wall.

According to the invention, this object is achieved by providing an elastomeric member along a periphery of the fan housing where the periphery meets a recess of the wall. The invention makes possible a constrained translational motion of the fan toward an opening at which that fan is to be installed, and in that context potential energy is stored in an elastic member, for example by elastic deformation of the elastic member. The translational motion can occur in that context approximately perpendicular to the axis of that wall opening, i.e. transversely to that axis. When the desired position relative to the opening is reached, at least a portion of that stored potential energy is converted into kinetic energy in order to displace a component of the fan into that opening and simultaneously to activate a sealing member that creates a seal between the housing of the fan and the wall portions surrounding the opening. A portion of the energy stored in the context of the translational motion can preferably be used to generate a continuous force on that seal; i.e. even when the fan is in the installed state, the potential energy that remains stored is preferably sufficient to maintain the sealed state continuously.

By ingenious "energy management" during the installation operation, the installation of such mini-fans can thus be carried out in very simple and inexpensive fashion, i.e. without tools; an additional advantage achieved is that direct transfer of solid-borne sound from the fan to a surrounding housing is at least greatly reduced. The result is that the fan can be mounted in very simple fashion and with good sealing, the transfer of solid-borne sound from the fan to the adjacent wall occurring only in damped fashion so that the overall noise level is lowered.

BRIEF FIGURE DESCRIPTION

Further details and advantageous refinements of the invention are evident from the exemplifying embodiments, in no way to be understood as a limitation of the invention, that are described below and depicted in the drawings. In the drawings:

FIG. 1 is a plan view of a housing wall having a substantially round recess in which a substantially round fan according to a first exemplifying embodiment of the invention is mounted; FIG. 1 is a somewhat enlarged depiction for illustrative purposes;

FIG. 9 is a plan view of a housing wall having a recess in which a fan according to a second exemplifying embodiment of the invention is mounted; FIG. 9 is a somewhat enlarged depiction for illustrative purposes;

FIG. 10 is a side view looking in the direction of arrow X of FIG. 9;

FIG. 11 is a side view looking in the direction of arrow XI of FIG. 9;

FIG. 12 is a side view looking in the direction of arrow XII of FIG. 9;

DETAILED DESCRIPTION

Figure 1:
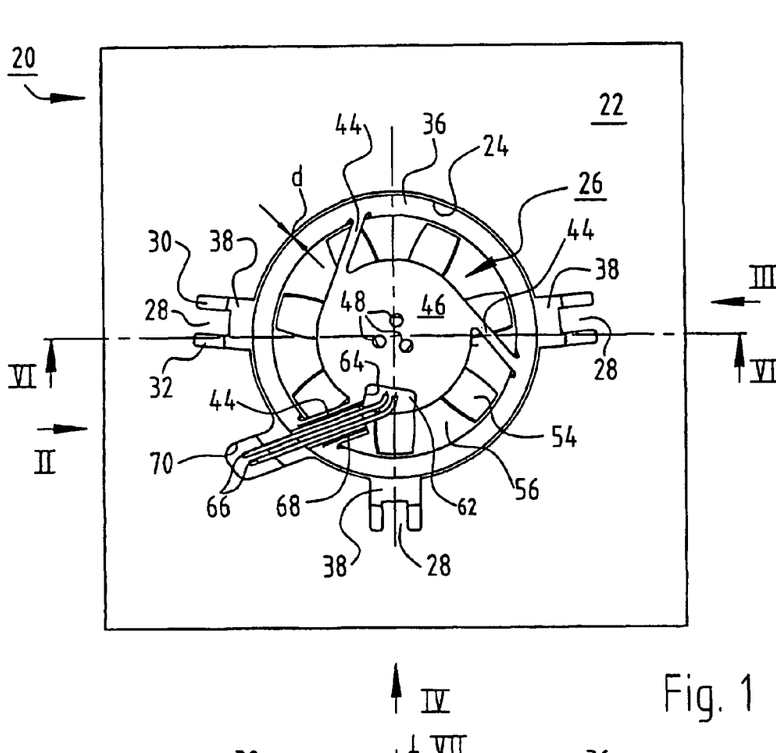
Figure 2:
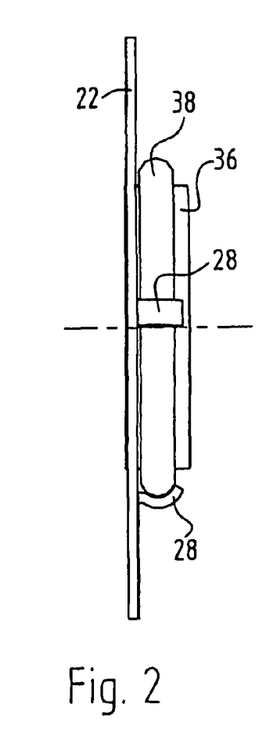
FIG. 2 is a side view looking in the direction of arrow II of FIG. 1.
Figure 3:
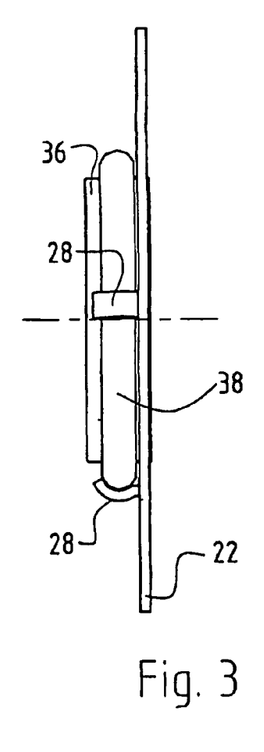
FIG. 3 is a side view looking in the direction of arrow III of FIG. 1.
Figure 4:
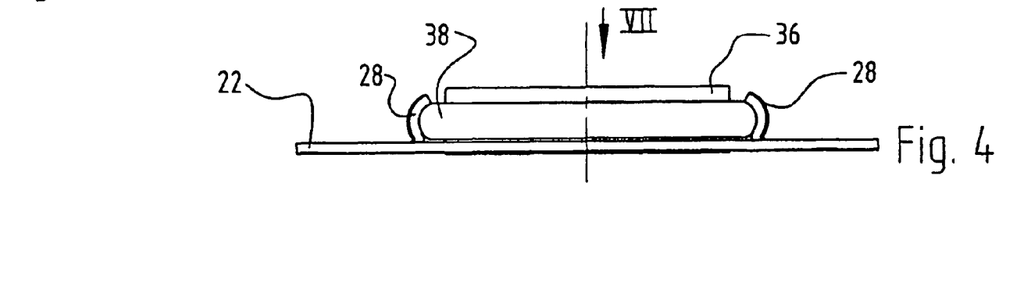
FIG. 4 is a side view looking in the direction of arrow IV of FIG. 1.

FIG. 1 shows an arrangement 20 having a wall 22 on which is located a substantially round recess 24 in which a substantially round fan 26 is mounted in low-vibration fashion. Fan 26 is at a distance d from the edge of recess 24, so that solid-borne sound cannot be transferred directly from the fan to wall 22.

Figure 5:
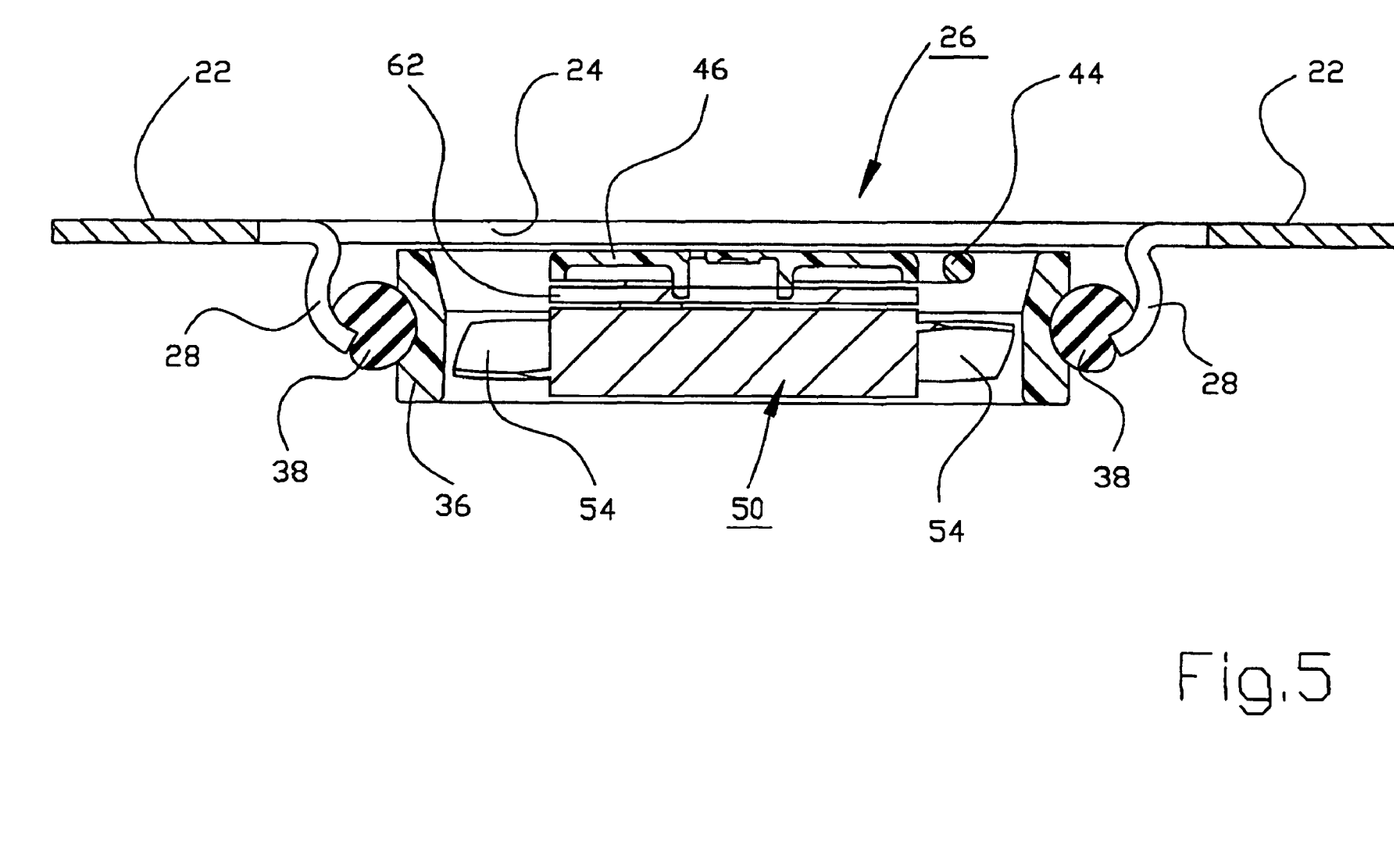
FIG. 5 is a sectioned depiction similar to FIG. 6, to explain the installation operation.

Implemented at the edge of recess 24 are a plurality of retaining members 28 whose shape is best inferred from FIGS. 1 and 5. In the context of the first embodiment according to FIGS. 1 through 8, retaining members 28 deflect substantially in the radial direction. They are each constituted by two parallel stamped cuts 30, 32 that extend approximately radially outward with respect to recess 24, and they are bent in the manner depicted in FIGS. 5 and 6 to form resilient tabs or retaining prongs that can deflect approximately radially outward upon installation and removal. In the region of their roots, retaining members 28 are preferably provided with a bead 34 for stiffening (see FIG. 7).

Figure 6:
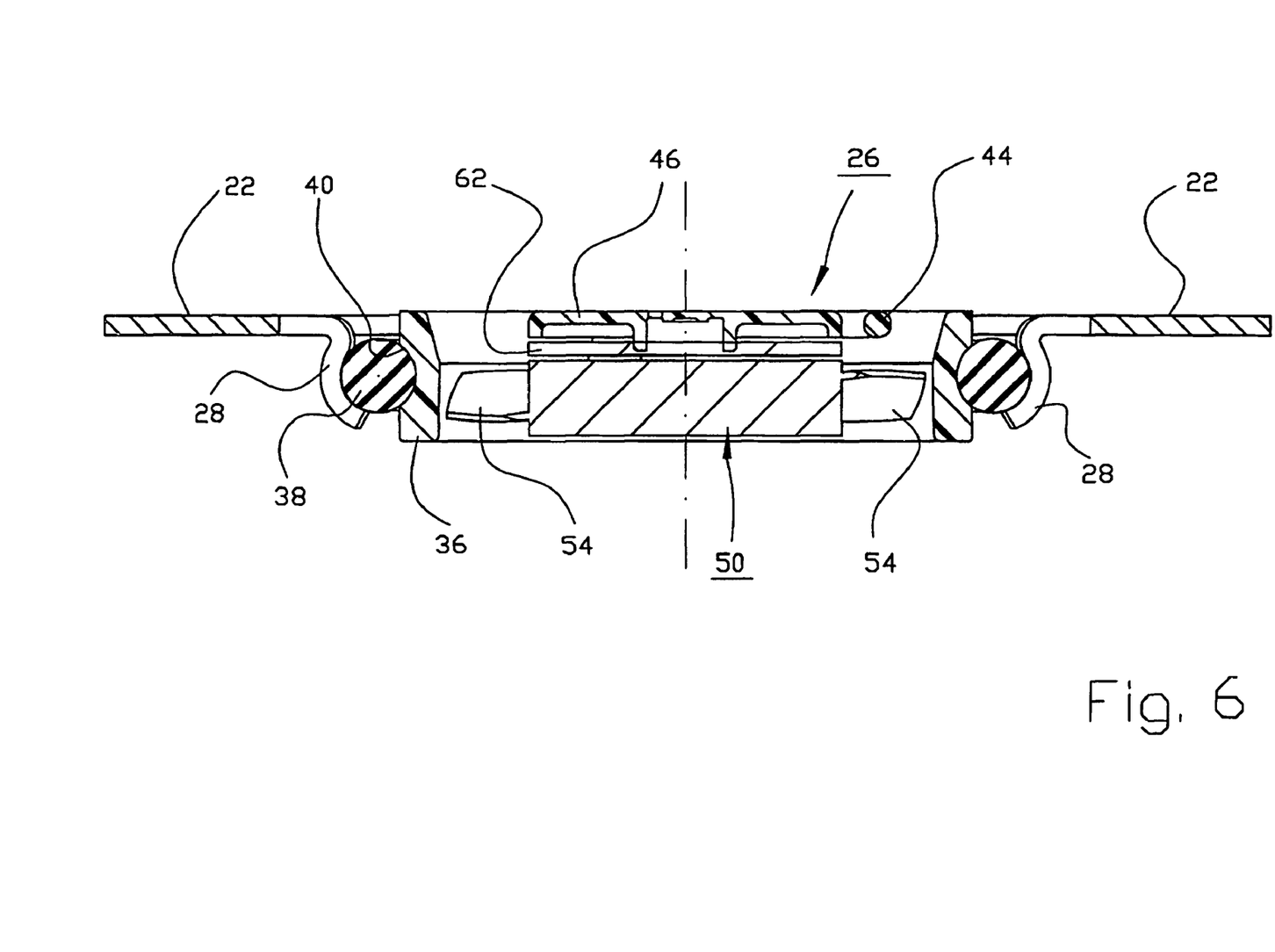
FIG. 6 is a section analogous to FIG. 5 looking along line VI-VI of FIG. 1, shown greatly enlarged; the motor is only schematically indicated.

As is apparent in particular from FIG. 6, fan 26 has for air guidance an outer housing part 36 which is substantially round in this embodiment but could also have a different shape, and on which is mounted in suitable fashion an annular elastomeric part, here in the form of an O-ring 38 made of rubber or the like. O-ring 38 is directly or nonpositively joined to an annular groove 40 of housing part 36, e.g. by adhesive bonding, vulcanization, or the like. In the installed state, it is in contact with an elastic preload both against the three retaining members 28 and against housing wall 22, and thereby largely seals housing part 36 of fan 26 against housing wall 22 (see FIG. 6).

Housing part 36 is joined via a plurality of obliquely extending struts 44 to a central hub 46 on which is mounted, by means of screws 48 or (preferably) by means of a press connection, an external-rotor motor 50 that is depicted only very schematically in FIGS. 5 and 6. Mounted on its external rotor 52 (FIG. 7) are fan blades 54 that rotate in a space 56 between housing part 36 and external rotor 52. In FIGS. 5 and 6 air is blown upward, i.e. between struts 44. It is clearly apparent that the invention is suitable for different types of fan, e.g. for axial fans, diagonal fans, and radial fans. Axial mini-fans are one important area of application.

Figure 7:
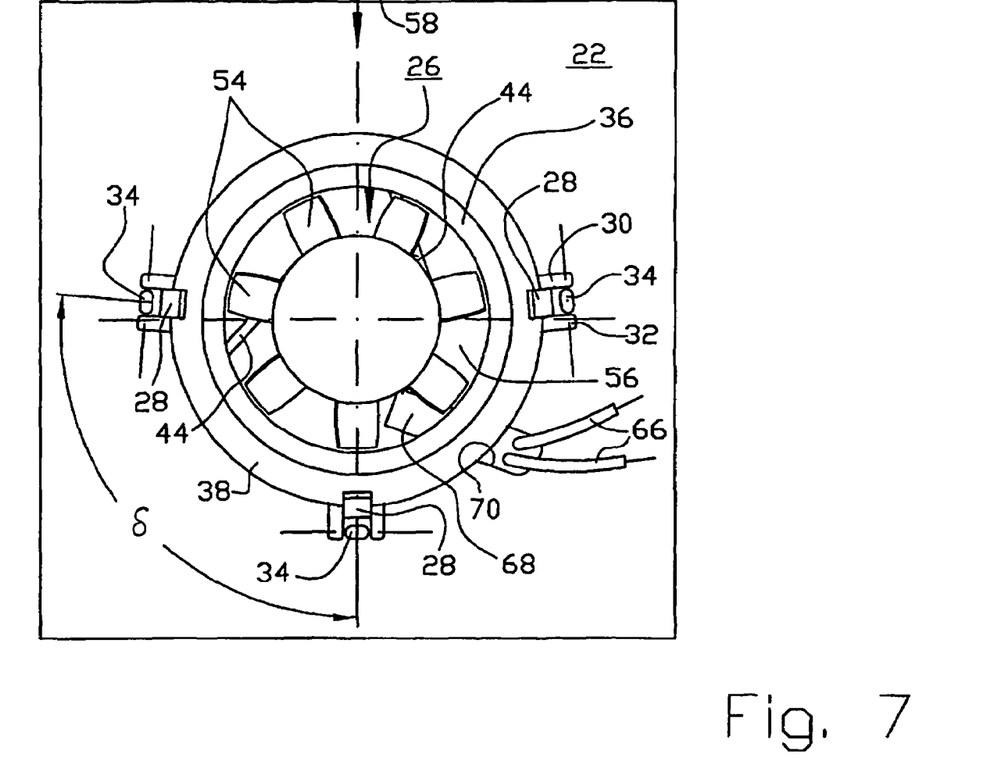
FIG. 7 depicts the arrangement of FIG. 1 from the back side, looking in the direction of arrow VII of FIG. 4.
Figure 8:
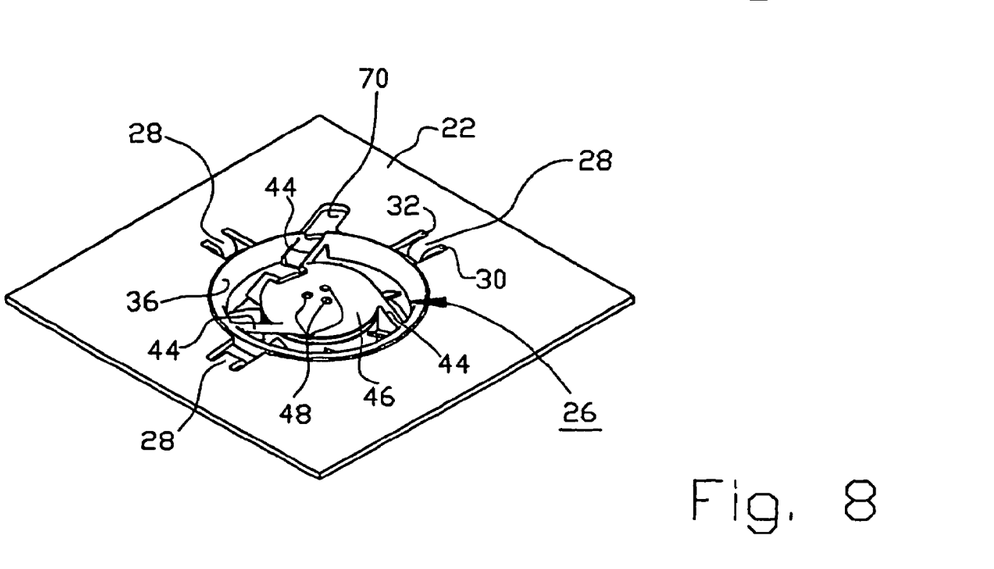
FIG. 8 is a perspective depiction of the arrangement according to FIGS. 1 through 7, approximately analogous to FIG. 1.

For installation, fan 26 is displaced from above (in FIG. 7) along housing wall 22 in the direction of an arrow 58, i.e. between two oppositely located retaining members 28, as is clearly evident from FIG. 7.

In that context, fan 26 as shown in FIG. 5 slides along housing wall 22, and upon contact with retaining members 28, O-ring 38 is deformed approximately as depicted in slightly exaggerated fashion in FIG. 5.

Lastly, fan 26 reaches a position as depicted in FIG. 6 and its housing part 36 snaps into recess 24 of housing wall 22; fan 26 thus moves upward, with reference to FIGS. 5 and 6, in response to the energy stored in O-ring 38, and preferably protrudes slightly out of housing wall 22. O-ring 38 rests with a preload against wall 22, as clearly shown by a comparison of FIGS. 5 and 6, thus constituting, upon installation, simultaneously a stop and a seal that seals housing part 36 against wall 22. Small openings that can additionally, as applicable, be sealed over with a self-adhesive tape remain in the region of retaining members 28. These openings correspond substantially to slots 30 and 32.

Motor 50 requires a supply of current, and has for that purpose a circuit board 62 with electronic components. Circuit board 62 is accessible via a cutout 64 (FIG. 1) of hub 46. Conductors 66 are soldered on in the region of this cutout, and are guided via a bridge 68 mounted on housing part 36 to an opening 70 of wall 22, and through that opening 70, in order to supply current to motor 50.

Removal of fan 26 is accomplished in the reverse order of installation, i.e. fan 26 is pressed downward in FIG. 6 and then pushed laterally out of retainers 28 in the direction opposite to arrow 58 of FIG. 7.

FIGS. 9 through 15 show a second exemplifying embodiment of the invention. As compared with the embodiment according to FIGS. 1 through 8, the second embodiment is more inexpensive to manufacture, and it makes possible subsequent removal of the fan only with exertion of a great deal of force. In addition, a strain-relief element for the connecting conductors is provided in this variant.

Commonalities exist between the first and the second embodiment. Identical or identically functioning parts are therefore labeled in FIGS. 9 through 15 with reference characters that are incremented by 100 as compared with FIGS. 1 through 8, e.g. 122 instead of 22. These parts are usually not described again.

Arrangement 120 has a wall 122 in which is located a recess 124 into which a fan 126 protrudes with a housing portion 127. Recess 124 and housing portion 127 are complementary in shape, e.g. substantially round as depicted.

Figure 14:
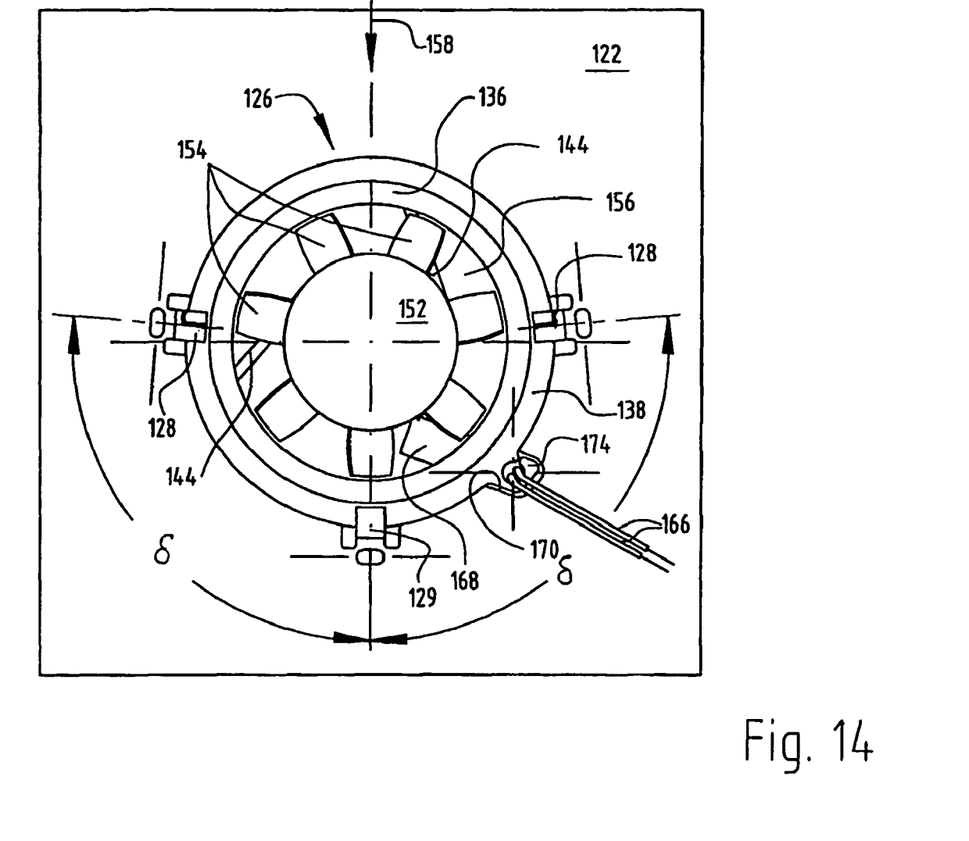
FIG. 14 depicts the arrangement of FIG. 9 from the back side, looking in the direction of arrow XIV of FIG. 12.
Figure 15:
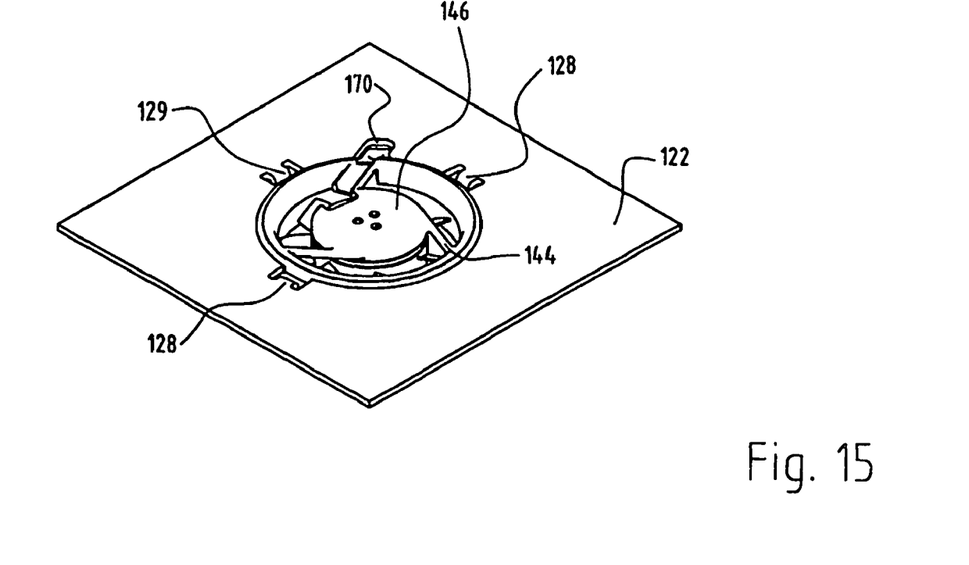
FIG. 15 is a perspective depiction of the arrangement of FIGS. 9 through 14, viewed approximately analogously to FIG. 9.

A plurality of retaining members or retaining prongs 128, 129 are implemented on the inner periphery of recess 124. The two retaining members 128 are located opposite one another, and guide fan 126 during its installation similarly to the way the lateral guides guide a drawer; fan 126 engages into retaining member 129 essentially only upon reaching its installed position. As FIG. 14 shows, each of retaining members 128 encloses with retaining member 129 an angle [delta] that is greater than 90 degrees, for example, 94 degrees as depicted. This applies similarly to FIGS. 1 through 8. The reason is that this arrangement prevents unintentional release of fan 26 or 126 from its installed position. As is evident, the mounting would be extraordinarily secure even at angles [delta] of 90 degrees or indeed less.

Figures 9, 10, 11, 12:
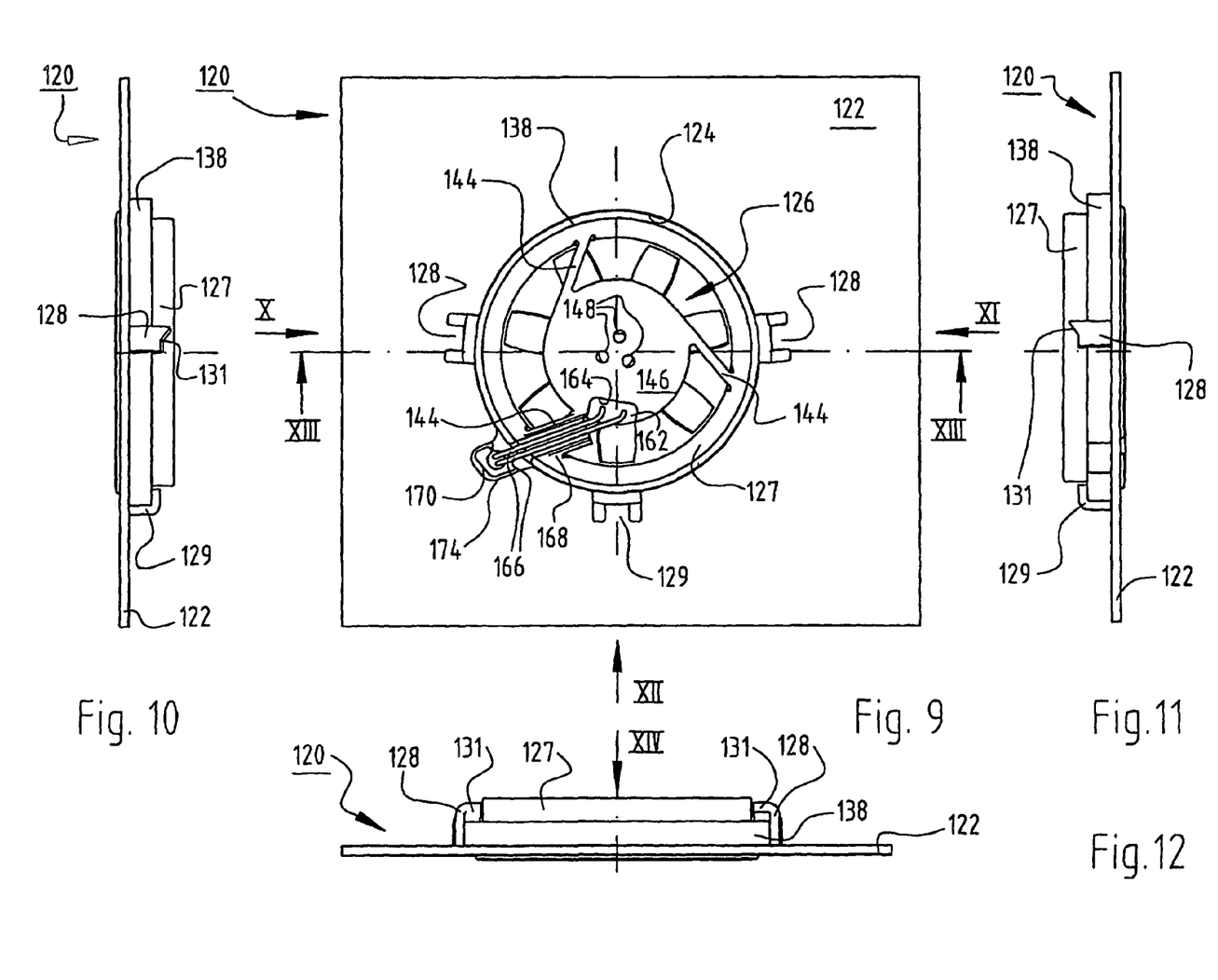
Figure 13:
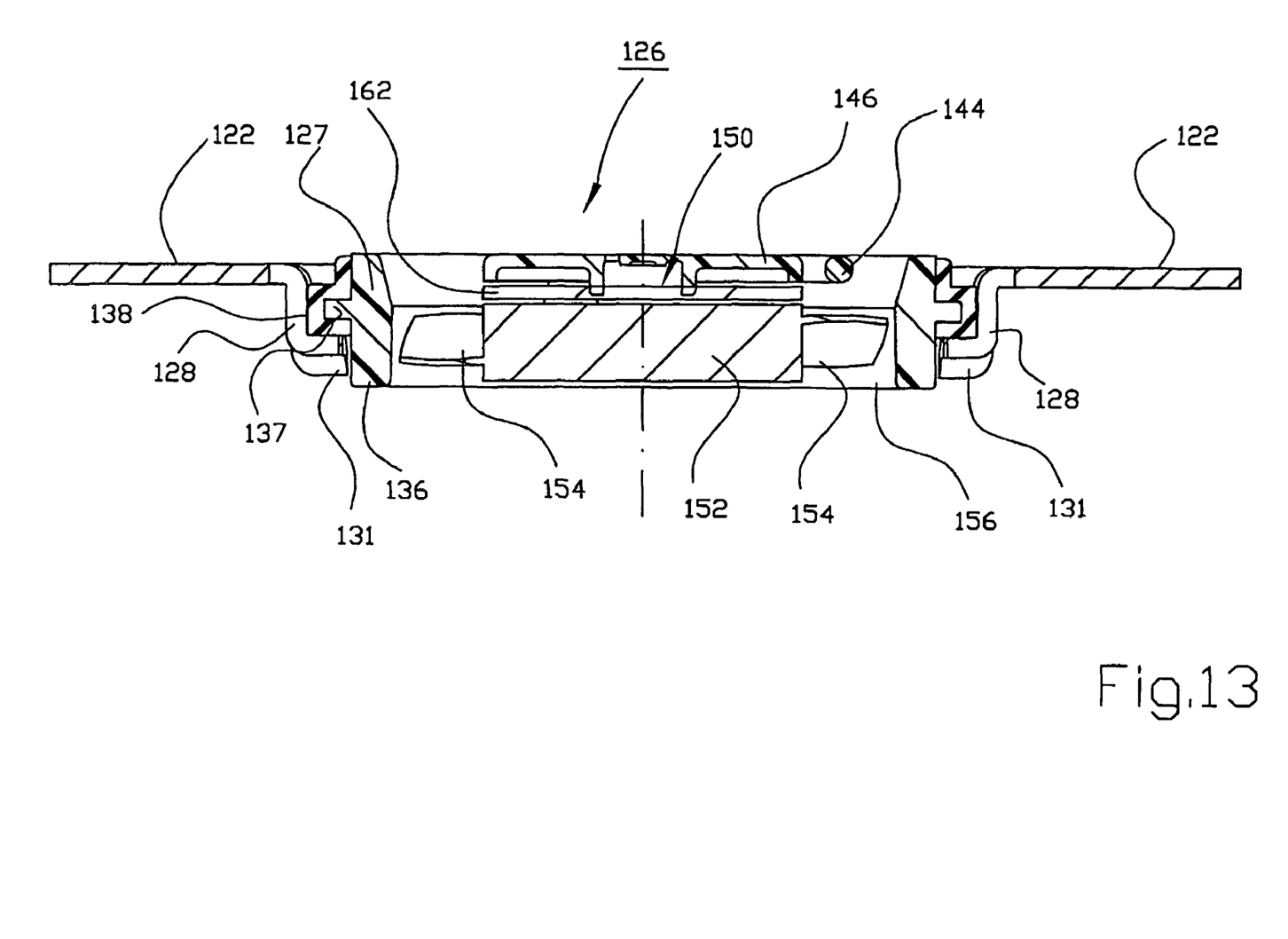
FIG. 13 is a section looking along line XIII-XIII of FIG. 9, shown greatly enlarged; the motor is only schematically indicated and is in its position after installation.

As is apparent from FIG. 13, fan 126 has for air guidance an outer housing part 136 whose upper portion 127 in FIG. 13 protrudes, in the installed state, into recess 124. On its outer periphery, housing part 136 has a radially projecting flange 137. The latter is surrounded on all three sides by a covering 138, made of an elastomeric material, that extends in FIG. 13 as far as the upper end of portion 127. Covering 138 can be made, for example, of rubber, and it is preferably manufactured together with housing part 136 using the two-component injection-molding method. As FIG. 13 shows, in the installed state covering 138 is in contact with a preload against wall 122, and thereby acts as a stop and as a seal between housing part 136 and wall 122. As depicted in FIG. 9, it also fills a gap between recess 124 and portion 127.

FIGS. 10 and 11 show that retaining member 129 takes the shape of a simple hook into which, upon installation, flange 137 is pushed with its covering 138. Lateral retaining members 128, on the other hand, have a shape such that the recess formed by them is widened toward the top, with reference to FIGS. 10 and 11, by an oblique surface 131. The oblique surfaces or walls 131 serve to facilitate installation.

Outer housing part 136 is joined via a plurality of obliquely extending struts 144 to a central hub 146 of the fan, on which hub is mounted, by means of screws 148 or (preferably) by means of a press connection, an external-rotor motor 150 that is depicted only very schematically in FIG. 13. Mounted on its external rotor 152 (FIG. 14) are fan blades 154 that rotate in a space 156 between outer housing part 136 and external rotor 152. Air is blown upward in FIG. 13, i.e. between struts 144.

For installation, fan 126 is displaced in a constrained translational motion from top to bottom in FIG. 14 along housing wall 122 in the direction of an arrow 158, i.e. between the two oppositely located retaining members 128, as clearly shown in FIGS. 13 and 14.

In that context, fan 126 slides (analogously to FIG. 5) along housing wall 122, and upon contact with retaining members 128 its elastomer covering 138 is correspondingly elastically deformed, potential energy thereby being stored in it. In FIG. 13 it is the lower part of covering 138 that is deformed, although this is not depicted in FIG. 13.

Lastly, the translational motion of fan 126 ends in a position such as the one depicted, for example, in FIG. 13, and its housing portion 127 snaps into recess 124 of housing wall 122; fan 126 is thus moved upward, with reference to FIG. 13, in response to the energy stored in elastomer covering 138, and thereafter preferably protrudes slightly out of housing wall 122. Covering 138 is in contact against wall 122 with a preload, and thus automatically constitutes, upon installation, a stop and a seal that seals outer housing part 136 against wall 122. The potential energy that was stored in covering 138 during the translational motion is therefore partially converted, in this position, into kinetic energy that ultimately moves the fan into its installed position and also maintains a pressure on that portion of covering 138 which acts as a seal in the installed position.

Small openings that can additionally, as applicable, be sealed over with a self-adhesive tape remain in the region of retaining members 128, 129. These openings correspond substantially to slots 30 and 32 of FIG. 8.

Motor 150 requires a supply of current, and has for that purpose a circuit board 162 with electronic components. Circuit board 162 is accessible via a cutout 164 (FIG. 9) of hub 146. Conductors 166 are soldered on in the region of this cutout, and are guided via a bridge 168 mounted on housing part 136 to an opening 170 of wall 122, and through that opening 170, in order to supply current to motor 150.

In this embodiment there is directly molded onto elastomer covering 138 a cable strain-relief element 174, which is manufactured from the same elastomer and whose shape, known per se, may be inferred from FIGS. 9 and 14. It prevents conductors 166 from being torn away from circuit board 162 in the event of a strong pull on them. At the same time, it prevents damage to the insulation of conductors 166 as a result of the sheet-metal edge of opening 170.

Lateral openings 70, 170 are preferably located in the region of one of the angles [delta] of FIG. 14, i.e. between two adjacent retaining clamps 128, 129, since this simplifies the installation of strain-relief element 174.

The invention thus utilizes a constrained translational motion of the fan—toward an opening at which that fan is to be installed—in order to store potential energy, e.g. by elastic deformation of an elastic member. The translational motion takes place transversely to the axis of that opening.

When the desired position with respect to the opening is reached, at least a portion of that stored potential energy is converted into kinetic energy, in order to move a component of the fan into that opening and simultaneously to activate a sealing member that creates a seal between the housing of the fan and a wall surrounding the opening. A portion of the energy stored in the context of the translational motion is preferably used to generate a continuous force on that seal, i.e. even with the fan in the installed state, some potential energy preferably remains stored in order continuously to maintain the sealed state. The seal acts simultaneously as a stop.

Ingenious "energy management" in the context of the installation operation thus renders the installation of such mini-fans very simple and inexpensive, with the additional advantage that direct transfer of solid-borne sound from the fan to a surrounding housing can be at least greatly reduced. The variant according to FIGS. 9 through 15 has the advantage, as compared to the one according to FIGS. 1 through 8, that it is particularly well-suited for the installation of mini-fans whose housing shape deviates from a circular shape, e.g. fans having a square housing shape, and for installation in a housing opening that likewise is approximately square in shape.

Many variants and modifications are of course possible within the scope of the present invention. In particular, the configuration of elastomer covering 38 or 138 is variable within wide limits as long as its essential functions are retained, namely reliable sealing between fan and wall, facilitation of installation and removal by elastic deformation of that elastomer, and functionality as a stop and a seal in the installed state. It is apparent, especially in the case of covering 138, that its parts (can) have different functions within the scope of the invention.

The invention claimed is:

1. A mini-fan (26; 126) for installation in a recess (24; 124) of a wall (22; 122), which wall is equipped on the periphery of the recess (24; 124) with a plurality of retaining members (28; 128, 129), said fan comprising, for air guidance,
a housing (36; 136) that, in an installed position, projects, with a housing portion (127) approximately complementary to the recess (24; 124) of the wall, into the recess (24; 124) of the wall (22; 122);
the mini-fan having at least one part (38; 138), shaped like an O-ring, attached to the periphery of that housing portion and made of an elastomeric material, with which part the fan (26; 126) is introducible, upon its installation with displacement along the wall (22; 122) into the retaining members (28; 128, 129) in order to bring the elastomeric part (38; 138), in an installed position, at least locally, into sealing contact against the wall (22; 122).

2. The mini-fan according to claim 1, wherein
the part (38; 138) made of elastomeric material is elastically deformable in the context of said displacement occurring along the wall (22; 122) in order to store, in it, energy with which the housing portion is movable, in its installed position, into the recess (24; 124) of the wall.

3. The mini-fan according to claim 2, which is shaped for engagement in a recess (24; 124) on which periphery are provided radially deflecting retaining members (28) for the fan.

4. The mini-fan according to claim 2, wherein a portion of the fan (26; 126) protrudes into the recess (24; 124) of the wall after installation of said fan into said recess, and said protruding portion is implemented substantially complementarily to the shape of that recess (24; 124).

5. The mini-fan according to claim 2, further comprising
a strain-relief member (174) which provides strain relief for a an electrical connecting cable (166) of the fan and wherein said strain-relief member is coupled to the part made of elastomeric material.

6. The mini-fan according to claim 1, wherein the part (38) made of elastomeric material is mounted in a groove on the periphery of the fan housing.

7. The mini-fan according to claim 1, which is shaped for engagement in a recess (24; 124) on whose periphery are provided radially deflecting retaining members (28) for the fan.

8. The mini-fan according to claim 1, which is implemented for installation on a wall, in which at least some of the retaining members (128), in the side on which the fan is introduced during installation, have an enlarged introduction opening.

9. The mini-fan according to claim 1, wherein a portion of the fan (26; 126) protrudes into the recess (24; 124) of the wall after installation of said fan into said recess, ans said protruding portion is implemented substantially complementarily to the shape of that recess (24; 124).

10. The mini-fan according to claim 1, wherein
the part (38; 138) made of elastomeric material is elastically deformable in the context of said displacement occurring along the wall (22; 122) in order to store, in it, energy with which the housing portion is movable, in its installed position, into the recess (24; 124) of the wall.

11. The mini-fan according to claim 10, wherein
the fan housing (136) is equipped on its periphery with a flange protrusion (137), and that flange protrusion (137) is equipped, at least locally, with a covering (138) made of elastomeric material.

12. The mini-fan according to claim 10, wherein
a portion of the fan (26; 126) protrudes into the recess (24; 124) of the wall after installation of said fan into said recess, and said protruding portion is implemented substantially complementarily to the shape of that recess (24; 124).

13. A mini-fan (26; 126) for installation in a recess (24; 124) of a wall (22; 122), which wall is equipped on the periphery of the recess (24; 124) with a plurality of retaining members (28; 128, 129), said fan comprising, for air guidance,
a housing (36; 136) that, in an installed position, projects with a housing portion (127) approximately complementary to the recess (24; 124) of the wall into the recess (24; 124) of the wall (22; 122);
the mini-fan having at least one part (38; 138) arranged on the periphery of that housing portion and made of an elastomeric material, with which part the fan (26; 126) is introducible, upon its installation with displacement along the wall (22; 122) into the retaining members (28; 128, 129) in order to bring the elastomeric part (38; 138) in an installed position, at least locally, into sealing contact against the wall (22; 122); and
wherein the fan housing (136) is equipped on its periphery with a flange protrusion (137) and that flange protrusion is equipped, at least locally, with a covering (138) made of elastomeric material, so configured that, with the fan in said installed position, said covering is, at least locally, in sealing contact against the wall.

14. The mini-fan according to claim 13, wherein the fan housing (136) is equipped on its periphery with a flange protrusion (137), and that flange protrusion (137) is equipped, at least locally, with a covering (138) made of elastomeric material.

15. A mini-fan (26; 126) for installation in a recess (24; 124) of a wall (22; 122), which wall is equipped on the periphery of the recess (24; 124) with a plurality of retaining members (28; 128, 129), said fan comprising, for air guidance,
a housing (36; 136) that, in an installed position, projects with a housing portion (127) approximately complementary to the recess (24; 124) of the wall into the recess (24; 124) of the wall (22; 122);
the mini-fan having at least one part (38; 138) arranged on the periphery of that housing portion and made of an elastomeric material, with which part the fan (26; 126) is introducible, upon its installation with displacement along the wall (22; 122) into the retaining members (28; 128, 129) in order to bring the elastomeric part (38; 138) in an installed position, at least locally, into sealing contact against the wall (22; 122); and further comprising
a strain-relief member (174) which provides strain relief for an electrical connecting cable (166) of the fan (26; 126) and wherein said strain-relief member is coupled to the part (38; 138) made of elastomeric material.

16. The fan according to claim 15, wherein the strain-relief member (174) is directly joined to the part made of elastomeric material.

17. The mini-fan according to claim 15, wherein the strain-relief member is implemented for arrangement in an orifice (170) of the wall (122).

18. The mini-fan according to claim 17, wherein the strain-relief member (174) is implemented for sealed arrangement in the orifice (170) of the wall (122).

19. A mini-fan (26; 126) for installation in a recess (24; 124) of a wall (22; 122), which wall is equipped on the periphery of the recess (24; 124) with a plurality of retaining members (28; 128, 129), said fan comprising, for air guidance,
a housing (36; 136) that, in an installed position, projects with a housing portion (127) approximately complementary to the recess (24; 124) of the wall into the recess (24; 124) of the wall (22; 122);
the mini-fan having at least one part (38; 138) arranged on the periphery of that housing portion and made of an elastomeric material, with which part the fan (26; 126) is introducible, upon its installation with displacement along the wall (22; 122) into the retaining members (28; 128, 129) in order to bring the elastomeric part (38; 138) in an installed position, at least locally, into sealing contact against the wall (22; 122); and
wherein the part made of elastomeric material is shaped like an O-ring (38), is attached to the periphery of the fan housing (36), and is elastically deformable in the context of said displacement occurring along the wall (22; 122) in order to store, in it, energy with which the housing portion is movable, in its installed position, into the recess (24; 124) of the wall.

20. A mini-fan (26; 126) for installation in a recess (24; 124) of a wall (22; 122), which wall is equipped on the periphery of the recess (24; 124) with a plurality of retaining members (28; 128, 129), said fan comprising, for air guidance,
a housing (36; 136) that, in an installed position, projects with a housing portion (127) approximately complementary to the recess (24; 124) of the wall into the recess (24; 124) of the wall (22; 122);
the mini-fan having at least one part (38; 138) arranged on the periphery of that housing portion and made of an elastomeric material, with which part the fan (26; 126) is introducible, upon its installation with displacement along the wall (22; 122) into the retaining members (28; 128, 129) in order to bring the elastomeric part (38; 138) in an installed position, at least locally, into sealing contact against the wall (22; 122); and
wherein said mini-fan is implemented for installation on a wall, in which at least some of the retaining members (128), on a side on which the fan (126) is introduced during installation, have an enlarged introduction opening (131).

21. In combination,
a wall (22; 122) formed with a recess;
a plurality of retaining members (28; 128, 129) arranged around a periphery (24; 124) of said recess, and a mini-fan (26; 126) adapted for installation in said recess of said wall (22; 122), said mini-fan having a housing (36; 136) that, in an installed position, projects with a housing portion (127) approximately complementary to the recess (24; 124) of the wall (22; 122) into the recess (24; 124) of the wall (22; 122)

the mini-fan having at least one part (38; 138) arranged on the periphery of said housing and made of an elastomeric material, with which part the fan (26; 126) is introducible, upon its installation with displacement along the wall (22; 122) into the retaining members (28; 128, 129), in order to bring the elastomeric part (38; 138), in the installed position, at least locally into sealing contact against the wall (22; 122).

\* \* \* \* \*